United States Patent [19]
Harada et al.

[11] Patent Number: 5,672,411
[45] Date of Patent: Sep. 30, 1997

[54] INSULATING BOARDS AND METHOD OF MANUFACTURING THE SAME

[75] Inventors: Keizo Harada; Kenichi Watanabe; Shosaku Yamanaka, all of Itami, Japan

[73] Assignee: Sumitomo Electric Industries, Ltd., Osaka, Japan

[21] Appl. No.: 352,905

[22] Filed: Dec. 9, 1994

[30] Foreign Application Priority Data

Jan. 25, 1994 [JP] Japan ................................. 6-006153

[51] Int. Cl.$^6$ ................................................. H01L 21/00
[52] U.S. Cl. ...................... 428/161; 428/141; 428/156; 428/446; 428/450; 428/469; 428/701; 428/702
[58] Field of Search ...................... 428/141, 156, 428/161, 426, 432, 433, 446, 450, 469, 701, 702; 427/569, 570, 574

[56] References Cited

U.S. PATENT DOCUMENTS

| | | | |
|---|---|---|---|
| 4,371,587 | 2/1983 | Peters | 428/446 |
| 4,794,048 | 12/1988 | Oboodi | 428/432 |
| 4,900,591 | 2/1990 | Bennett et al. | 427/255 |

FOREIGN PATENT DOCUMENTS

| | | |
|---|---|---|
| 0299754 | 1/1989 | European Pat. Off. . |
| 0428839 | 5/1991 | European Pat. Off. . |

OTHER PUBLICATIONS

Hatanaka et al., "$H_2O$–Teos Plasma–CVD Realizing Dielectrics Having a Smooth Surface", VMIC Conference, Jun. 11–12, 1991, pp. 435–441.

Primary Examiner—Archene Turner
Attorney, Agent, or Firm—Wenderoth, Lind & Ponack

[57] ABSTRACT

An insulating board having a substrate, and an insulating film of silicon oxide formed on the surface of the substrate by vapor phase deposition. In forming the film, the forming conditions are controlled so that the film is formed in an overhang or conformal shape at initial stage and then in a flow shape. Thereby, both good adhesion and excellent insulation properties are achieved.

4 Claims, 4 Drawing Sheets

INSULATING BOARDS AND METHOD OF MANUFACTURING THE SAME

BACKGROUND OF THE INVENTION

The present invention relates to an insulated board for use in semiconductor devices and film capacitors, and more specifically an insulating board having a substrate on which is formed a coating of an insulating film that shows stable electric properties and excellent adhesion, and a method of manufacturing the same.

Recent semiconductor devices are characterized by a high degree of integration and attendant high aspect ratio in the difference in levels of elements on the chip surface. Also, many recent metal-based film capacitors and sensor chips formed of rolled materials have rather rough surfaces due to damage or mars formed by rolling. Thus, insulating films are required which remain smooth and free of voids, which can cause various mechanical or electrical defects, even if they are formed on rather rough substrate surfaces.

A technique for manufacturing insulating films that answers this demand was reported in Jun. 11–12, 1991 VMIC Conference (P435-441). In this technique, a flow-shaped silicon oxide film is formed by a plasma CVD method using a reaction source gas such as $H_2O$ or TEOS.

Such a silicon film can be deposited uniformly on a substrate surface irrespective of the surface irregularity of the substrate. The inventors have confirmed that such a silicon film shows stable insulating properties even if it is formed on a rolled metal plate which has been irregularly damaged during rolling.

But such a flow-shaped insulating film is low in adhesion to the substrate and thus can easily peel off. A flow-shaped film formed on a metal substrate having a large thermal expansion coefficient is especially low in adhesion to the substrate due to large thermal stresses inevitably applied during the heating and cooling process. Such a film is practically useless.

An object of the present invention is to provide an insulating board having an insulating film which is superior both in insulating properties and adhesion to the substrate, and a method of manufacturing such a board.

SUMMARY OF THE INVENTION

According to the present invention, there is provided an insulating board comprising a substrate, and an insulating film of silicon oxide formed on the surface of the substrate by vapor phase deposition using an organic silicone as a reaction source gas, wherein at the corners of each recess of the substrate, the insulating film is accumulated with an angle θ, which is shown in FIGS. 1A and 1B and defines the step coverage of the film, varying continuously or in steps from θ≦0 to θ>0 and from the interface with the substrate toward the surface of the insulating board.

BRIEF DESCRIPTION OF THE DRAWINGS

Other features and objects of the present invention will become apparent from the following description made with reference to the accompanying drawings, in which.

DETAILED DESCRIPTION OF THE INVENTION

We will now describe in detail the insulating film and the manufacturing method thereof.

In the case of the aforementioned flow-type film, a flow-shaped deposition of the material occurs on the surface of the substrate due to a pseudo-liquid behavior of a high-molecular weight polymer. Such a film is inevitably low in adhesion to the substrate because it is simply adsorbed to the substrate without forming chemical bonds at the interface with the substrate.

On the other hand, when forming a silicon oxide film by an ordinary plasma or thermal CVD method, deposition of film occurs by the reaction of chemically active radical ions on the substrate surface, thus forming chemical bonds at the interface. This increases the adhesion of the film to the substrate. But since this reaction is a solid reaction, no flow-shaped film is obtainable. Namely, the resulting film would have a conformal or overhanging shape, so that its step coverage is low and the insulating properties tend to be unstable if the substrate surface is rough.

As a result of continued effort to develop an insulating film having excellent insulating properties and at the same time good adhesion to the substrate, the inventors have discovered that this object is achievable by first forming a silicon oxide film having a conformal or overhanging shape, which is high in adhesion to the substrate, and then growing the film into a flow shape without forming any interface in the film.

Figure 1A:
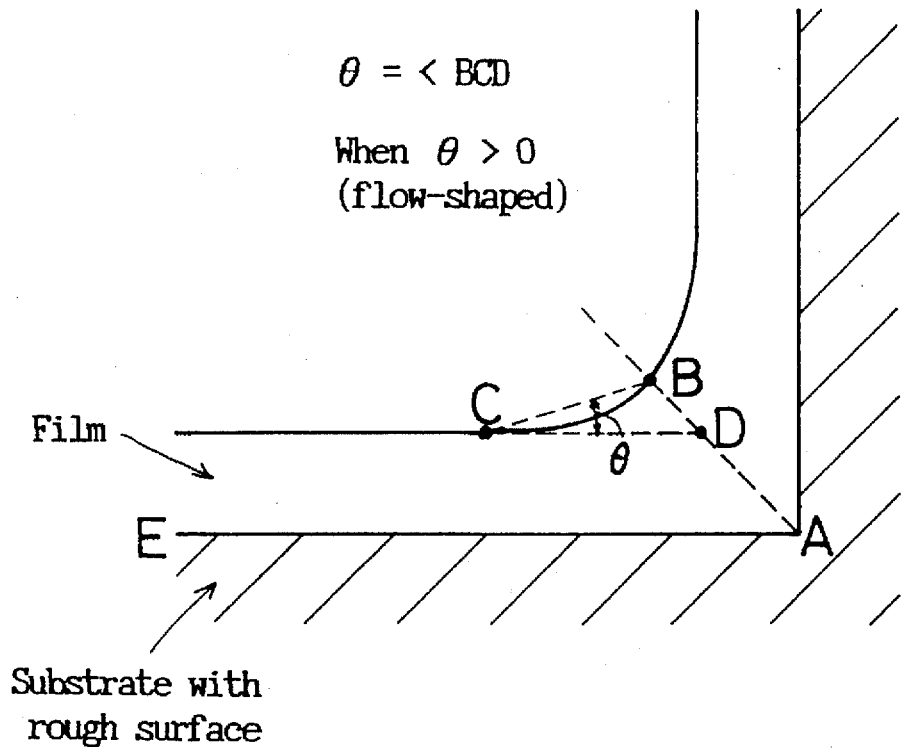
FIG. 1A is a sectional view of a flow-shaped film.
Figure 2:
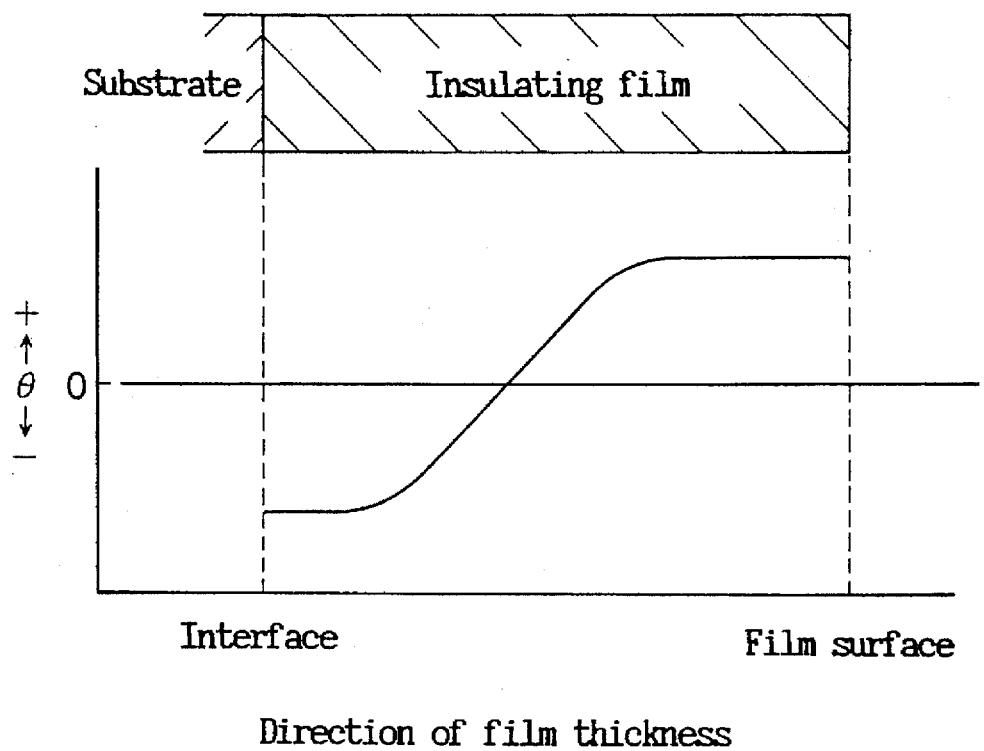
FIG. 2 is a graph showing an example of state of deposition (with varying angle θ) of an insulating film formed on the board according to the present invention.
Figure 7:
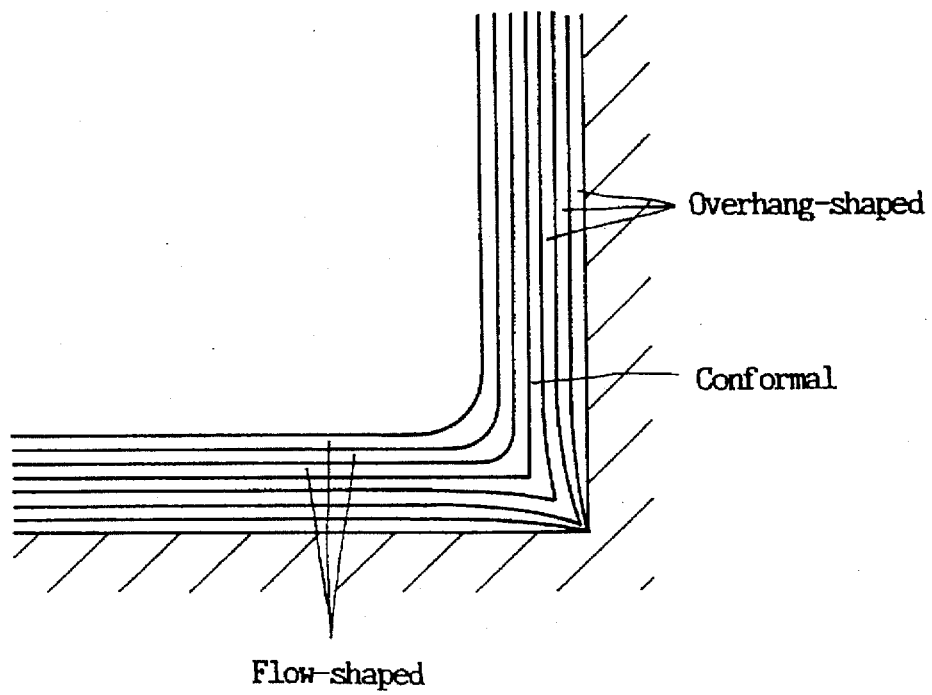
FIG. 7 is a schematic view showing by example how the film grows.

FIG. 2 shows an example of an insulating film deposited on a substrate of the insulating board according to the present invention. The insulating film presents a flow shape when θ>0, a conformal shape when θ=0, and an overhanging shape when θ<0. θ is the angle that defines the step coverage of the film (angle BCD in FIG. 1A and B). In this example, the angle θ changes continuously in the direction of thickness of the film. But it may change in steps. FIG. 7 shows an example of growing steps of the film (the angle θ changing from minus to plus). This figure was formed by superimposing the sections of film in time sequence. Thus, the actual film does not have the interfaces as shown in this figure.

The thickness of the film at its flow-shaped portion is determined according to the surface irregularity so that the film will cover the entire irregular portion of the substrate surface.

Such a flow-shaped silicon oxide film is slightly inferior to ordinary films in electrical properties such as leakage current and breakdown voltage, and moisture resistance. To cover up these shortcomings, it is preferable to laminate thereon an ordinary silicon oxide film or silicon nitride film formed by plasma CVD.

The insulating board may further comprise a film selected from the group consisting of a silicon oxide film, a silicon nitride film and a film of a mixture of silicon oxide and silicon nitride, formed on the insulating film by a plasma CVD method.

The substrate may be a rolled metal sheet having an irregular surface resulting from damage while rolling, for example a copper or copper alloy sheet.

The adhesion strength of the insulating film to the substrate is preferably 50 kgf/cm$^2$ or higher, and the leakage current density of the insulating film is preferably $10^{-8}$ A/cm$^2$ or lower.

Next, we shall describe in detail the manufacturing method of the insulating board according to the present invention (more specifically, the method of forming its insulating film). According to the present invention, an insulating film having the angle θ changing in the thickness direction of the film is formed by plasma CVD using an organic silicone and H$_2$O as reaction source gases, while restricting the film forming temperature below 200° C. and changing the reaction gas pressure throughout the film forming process.

If the film forming temperature exceeds 200° C., it is impossible to form a flow-shaped film even if other film forming conditions are changed. Namely, films formed at such high temperatures will have conformal or overhanging shapes with θ≦0, not flow shape.

The inventors found that the reaction gas pressure while forming a film is a parameter that determines the angle θ. This finding and continued experiments led us to the finding that a film having a high adhesion to the substrate having an irregular surface is obtainable at the initial stage of film forming process by controlling the reaction gas pressure at 1 Torr or less under the above-described conditions, whereas an upper film layer can be formed into a flow-shaped film (θ>0) by increasing the gas pressure to a range between 2 and 20 Torr continuously or in steps. Such an upper film layer is high in step coverage even on a substrate having a rough surface and thus shows stable insulating properties.

It was also found that by repeating plasma discharge within the pressure range for forming a flow-shaped film, while supplying only H$_2$O, the adhesion of the insulating film improves still further.

We have also found that the flow ratio of an organic silicone gas to H$_2$O gas should preferably be within the range between 5:1 and 1:10. If this ratio is more than 5:1, it is difficult to come up with a uniform film. If less than 1:10, the same will happen as when the film forming temperature exceeds 200° C.

The method may further comprise a step of forming, by a plasma CVD method, a film selected from the group consisting of a silicon oxide film, a silicon nitride film and a film of a mixture of silicon oxide and silicon nitride, on the insulating film formed on the substrate, using a member selected from the group consisting of SiH$_4$ and N$_2$O, SiH$_4$ and NH$_3$, and SiH$_4$ and N$_2$O or NH$_3$ as reaction source gases.

As will be already apparent, according to the present invention, by changing the film depositing conditions during the process, the resulting film has both the advantage of a film having an overhanging or conformal shape (excellent adhesion to the substrate) and that of a flow-shaped film (stable insulating properties resulting from high step coverage). An insulating board having such an insulating film will exhibit practically satisfactory performance even if its substrate has a rather rough surface.

The insulating board according to the present invention is superior both in the adhesion of film to the substrate and the insulating properties even if the film is formed on a rough-surfaced substrate, such as a rolled metal plate or a substrate carrying ultra-thin wirings on its surface.

Now we will describe embodiments of the present invention.

Embodiment 1

Figure 3:
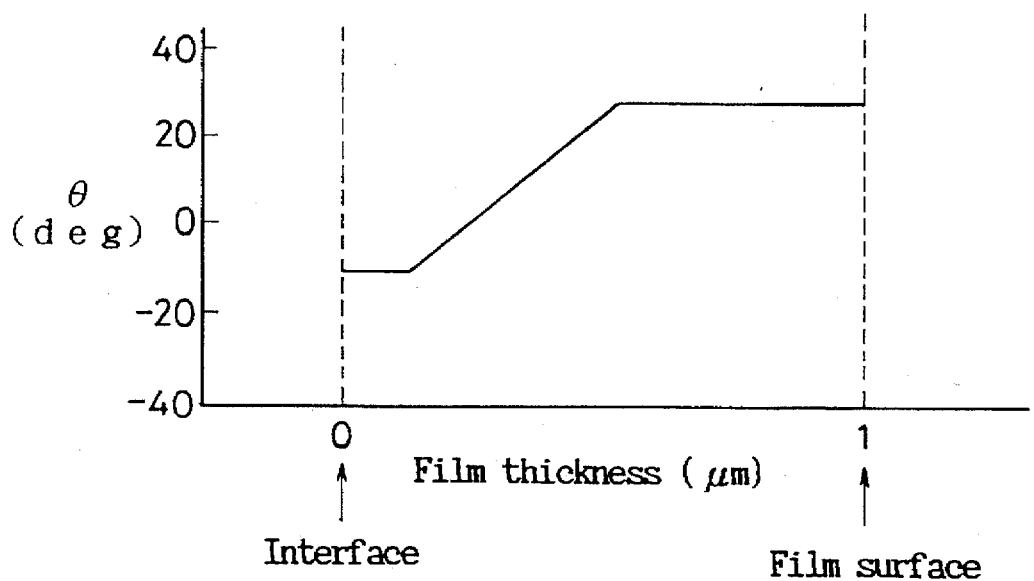
FIG. 3 is a graph showing how the angle θ changes in a board (Embodiment 1)

Al wirings each 0.5 μm wide, 0.6 μm high, and 100 mm long were formed with spacing of 0.5 μm on a 6-inch diameter silicon substrate. An insulating film of silicon oxide was formed on the substrate thus formed using the method according to the present invention. The insulating film was formed so that the angle θ will vary in the direction of thickness as shown in FIG. 3. The thickness of the film layer was 1 μm thick at its wiring-free flat portion. An Al electrode as a top electrode was formed on the insulating film so as to cover its entire surface. We manufactured 10 pieces of such insulating boards (Articles according to the invention).

For comparison purposes, we also manufactured 10 insulating boards having an insulating film having an angle θ of −10° (constant) and having an overhanging shape and 10 insulated boards having an insulating film having an angle θ of 30° (constant) and having a flow shape (Control Articles 1 and 2). These Control Articles are structurally the same as Articles of the invention except the depositing structure of insulating film.

We tested these three kinds of insulating boards for the following properties:

(1) Leakage Current Density

The leakage current density was measured between 100 Al wirings formed on each board and the upper Al electrode, with a DC voltage of 5 V applied. The boards that showed a lower leakage voltage density than a threshold of $10^{-8}$ A/cm$^2$ were judged to be Non-defective, while those higher than this threshold were judged Defective.

(2) Adhesion

In order to judge the adhesion of the film to the substrate, we conducted a tensile strength test of films using a SEBASTIAN ADHERENCE TESTER (made by Quad Group). In this test, we measured the testile strength at 100 points for each sample. We judged the samples that showed an adhesion strength equal to or higher than 50 kgf/cm$^2$ to be Non-defective and calculated the non-defective rate.

Leakage current density was measured before and after subjecting the samples to a 1000-cycle temperature cycle test, each cycle being −65° C.(30 min.)→normal temperature (10 min.)→150° C. (30 min.).

The results are shown below.

| | Leakage current density (Number of non-defective/ number of total pieces) | | Adhesion strength |
|---|---|---|---|
| | Before temperature cycle test | After temperature cycle test | Non-defective rate in tensile test (%) |
| Article of the invention | 998/1000 | 998/1000 | 100 |
| Control article 1 (θ = −10°) | 736/1000 | 251/1000 | 100 |
| Control article 2 (θ = 30°) | 997/1000 | 997/1000 | 68 |

We then analyzed the test samples that were judged defectives in the leakage current density test. It was found out that while in Articles of the Invention and Control Articles 2 the cause of defects was the intrusion of foreign matter such as dust, the cause of defects in Control Articles 1 was voids formed in the insulating film. Especially after the temperature cycle test, the number of defectives increased markedly as a result of the voids being broken by repeated thermal stresses applied. Control Articles 2 had a problem in that the insulating film easily peeled off the silicon substrate with Al wirings. Thus, the non-defective rate was low in the tensile test.

Embodiment 2

Figure 4:
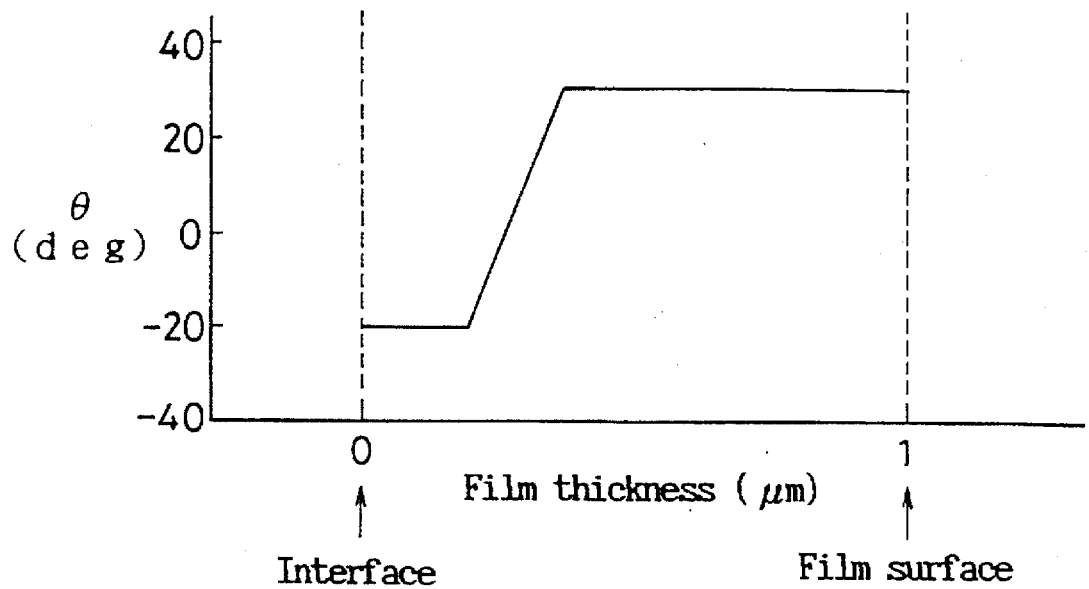
FIG. 4 is another graph showing how the angle θ changes in a board (Embodiment 2)

A 1-μm thick silicon oxide insulating film was formed by the method according to the present invention on a SUS631 stainless steel rolled substrate having a surface roughness of Rmax=0.8 μm and measuring 50×50 mm with 0.5 mm thickness so that the angle θ will change in the thickness direction of the film as shown in FIG. 4. A 30×30 mm Al electrode as a top electrode was formed on the insulating film. We manufactured 100 pieces of such insulating boards (Articles according to the invention).

For comparison purposes, we also manufactured 100 insulating boards having an insulating film having an angle θ of −5° (constant) and having an overhanging shape (Control Article 1) and 100 insulating boards having an insulating film having an angle θ of 20° (constant) and having a flow shape (Control Article 2). These Control Articles are structurally the same as Articles of the invention except the abovementioned differences.

We tested these three kinds of insulated boards in the same manner as in Embodiment 1. In the leakage current density test, we measured the current leakage between the top Al electrode and the substrate as a lower electrode.

The results are shown below.

|  | Leakage current density (Number of non-defective/ number of total pieces) | | Adhesion strength |
|---|---|---|---|
|  | Before temperature cycle test | After temperature cycle test | Non-defective rate in tensile test (%) |
| Article of the invention | 96/100 | 96/100 | 100 |
| Control article 1 (θ = −5°) | 67/100 | 28/100 | 100 |
| Control article 2 (θ = 20°) | 98/100 | 98/100 | 37 |

The causes of defects are substantially the same as those mentioned in Embodiment 1. But it is noteworthy that in this embodiment, the adhesion of flow-shaped films to: the rolled substrate is significantly lower.

Embodiment 3

Figure 5:
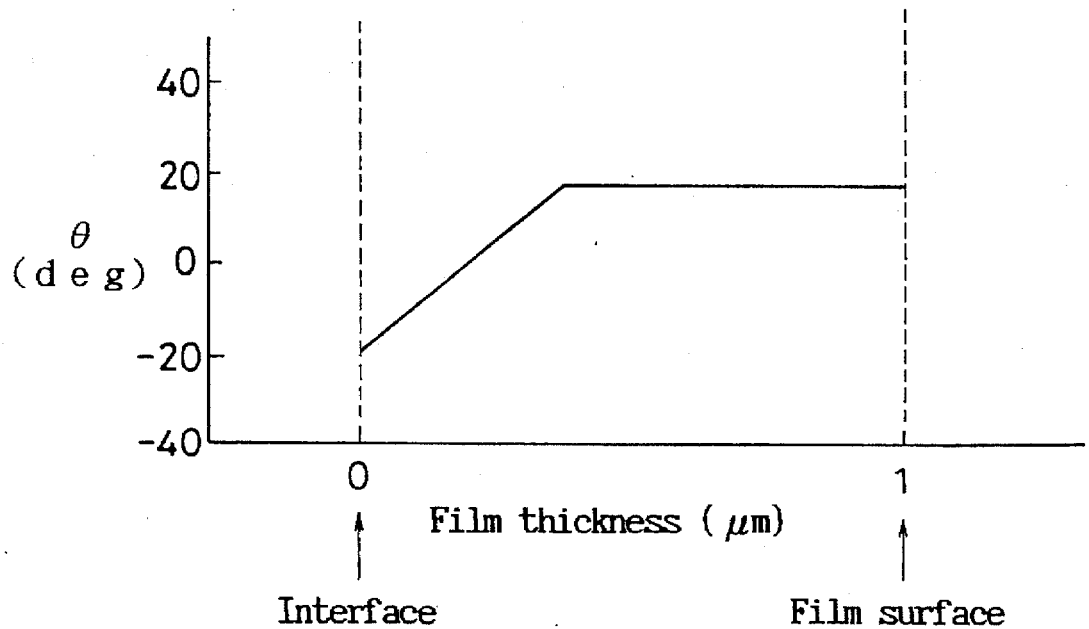
FIG. 5 is a further graph showing how the angle θ changes in a board (Embodiment 3)

A 1-μm thick silicon oxide insulating film was formed by the method according to the present invention on an OLIN 197 copper alloy rolled substrate having a surface roughness of Rmax=1.0 μm and measuring 50×50 mm with 1 mm thickness so that the angle θ will change in the thickness direction of the film as shown in FIG. 5. A 30×30 mm Al electrode as a top electrode was formed on the insulating film. We manufactured 100 such insulating boards (Articles according to the invention).

For comparison purposes, we also manufactured 100 insulating boards having an insulating film having an angle θ of −15° (constant) and having an overhanging shape (Control Article 1) and 100 insulating boards having an insulating film having an angle θ of 30° (constant) and having a flow shape (Control Article 2). These Control Articles are structurally the same as Articles of the invention except the abovementioned differences.

We tested these three kinds of insulated boards in the same manner as in Embodiment 1. Leakage current density test was measured in the same way as in Embodiment 2.

The results are shown below.

|  | Leakage current density (Number of non-defective/ number of total pieces) | | Adhesion strength |
|---|---|---|---|
|  | Before temperature cycle test | After temperature cycle test | Non-defective rate in tensile test (%) |
| Article of the invention | 98/100 | 98/100 | 100 |
| Control article 1 (θ = −15°) | 62/100 | 21/100 | 100 |
| Control article 2 (θ = 30°) | 95/100 | 95/100 | 29 |

These results are substantially the same as those in Embodiment 2.

Embodiment 4

The same insulating film as in Embodiment 3 was formed on the same copper alloy rolled substrate as used in Embodiment 3. A 0.3-μm thick silicon nitride film was further formed on the insulating film under the following conditions by a plasma CVD method. We manufactured 100 such insulating boards.

| Reaction gas and flow rate | $SiH_4$ 30 sccm, $NH_2$ 300 sccm |
|---|---|
| Gas pressure | 0.5 Torr |
| Temperature of board | 280° C. |
| RF (13.56 MHz) output | 500 W |

These boards were subjected to a high-temperature high-humidity moisture resistance test in which they were placed in an atmosphere of 85° C. with 85% humidity for 1000 hours. Before the test, 99 out of 100 boards were judged non-defectives. After the test, this figure remained unchanged and no degradation due to moisture absorption was observed.

Embodiment 5

The boards of this embodiment differ from those of Embodiment 4 in that the silicon nitride film used in Embodiment 4 is replaced by a 0.5-μm thick silicon oxide film formed by plasma CVD under the conditions specified below. These boards were subjected to a moisture resistance test under the same conditions as in Embodiment 4. No degradation due to moisture absorption was observed, either.

| Reaction gas and flow rate | $SiH_4$ 30 sccm, $H_2O$ 200 sccm |
|---|---|
| Gas pressure | 0.5 Torr |
| Temperature of board | 300° C. |
| RF (13.56 MHz) output | 500 W |

Embodiment 6

Figure 6:
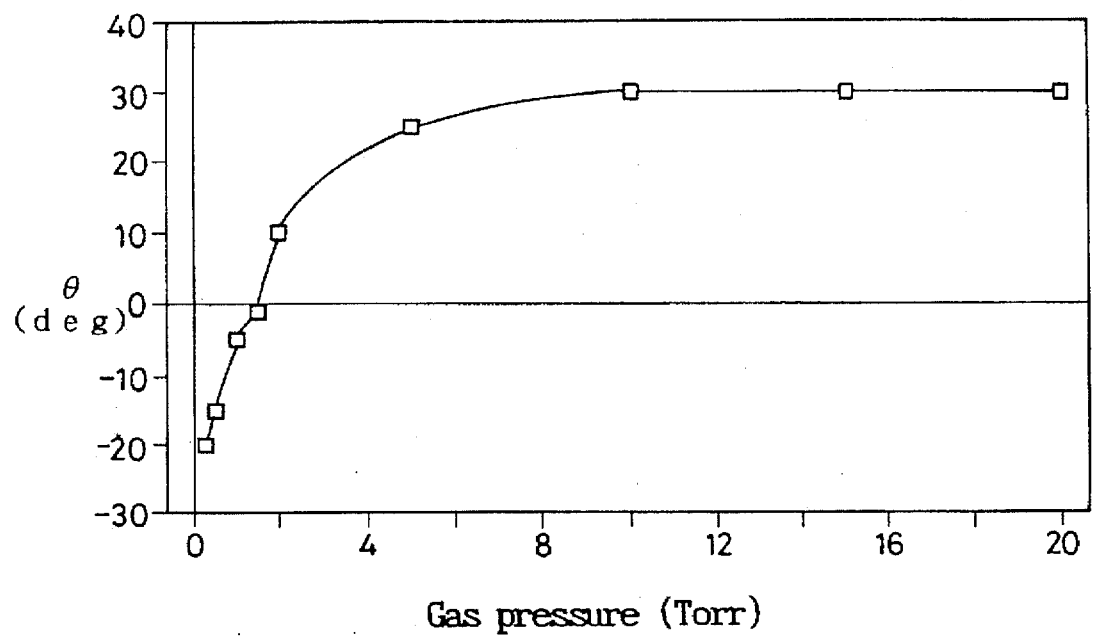
FIG. 6 is still a further graph showing how the angle θ changes with the reaction gas pressure.

A silicon oxide film was formed on a silicon substrate having steps under the following conditions and the step coverage θ of the film against the substrate was measured. The results are shown in FIG. 6.

| Reaction gas and flow rate | Si(C₂H₅O)₄ 60 sccm, H₂O 50 sccm |
|---|---|
| Temperature of board | 150° C. |
| RF (13.56 MHz) output | 500 W |
| Reaction gas pressure | 0.3–20 Torr |

The results show that the value θ changes from negative to positive with increase in the reaction gas pressure. Thus, a silicon oxide insulating film was formed under the following conditions on an OLIN 197 copper alloy rolled substrate having a surface roughness of Rmax=1.0 μm and measuring 50×50 mm with 1 mm thickness, while controlling the gas pressure in the manner as shown in FIG. 6.

| Reaction gas and flow rate | Si(C₂H₅O)₄ 60 sccm, H₂O 50 sccm |
|---|---|
| Temperature of board | 150° C. |
| RF (13.56 MHz) output | 500 W |

The insulating boards thus obtained were subjected to the same evaluation tests as in Embodiment 1. They achieved good results both in the adhesion of film to the substrate and the leakage current.

Figure 1B:
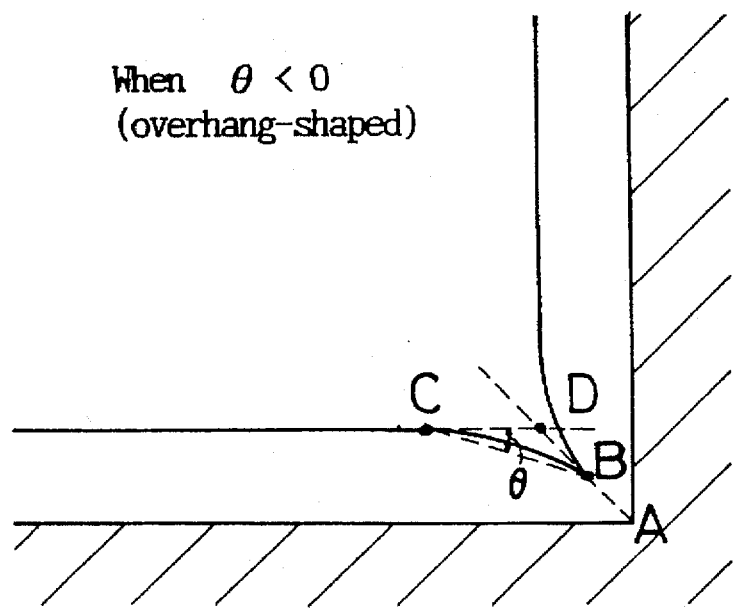
FIG. 1B is a sectional view of a film having an overhanging shape.

What is claimed is:

1. An insulating board comprising a substrate, and an insulating film of silicon oxide formed on the surface of said substrate by vapor phase deposition using an organic silicone as a reaction source gas, where at the corners of each recess of the substrate, said insulating film is accumulated with an angle θ, which is shown in FIGS. 1A and 1B and defines the step coverage of the film, varying continuously or in steps from θ≦0 to θ>0 and from the interface with said substrate toward the surface of the insulating board, and wherein the adhesion strength of said insulating film to said substrate is 50 kgf/cm² or higher, and the leakage current density of said insulating film is $10^{-8}$ A/cm² or lower.

2. An insulating board as claimed in claim 1, further comprising a film selected from the group consisting of a silicon oxide film, a silicon nitride film and a film of a mixture of silicon oxide and silicon nitride, formed on said insulating film or said substrate by plasma CVD method.

3. An insulating board as claimed in claim 1 or 2 wherein said substrate is a rolled metal sheet having an irregular surface resulting from damage while rolling.

4. An insulating board as claimed in claim 3 wherein said rolled metal sheet is of copper or a copper alloy.

* * * * *